(12) United States Patent
Aksyuk et al.

(10) Patent No.: US 6,366,414 B1
(45) Date of Patent: Apr. 2, 2002

(54) MICRO-ELECTRO-MECHANICAL OPTICAL DEVICE

(75) Inventors: Vladimir Anatolyevich Aksyuk, Piscataway; David John Bishop, Summit, both of NJ (US)

(73) Assignees: Agere Systems Guardian Corp., Orlando, FL (US); Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/390,157

(22) Filed: Sep. 3, 1999

(51) Int. Cl.[7] ............................. G02B 7/02; G02B 26/08
(52) U.S. Cl. ....................................... 359/822; 359/223
(58) Field of Search .............................. 359/223, 224, 359/225, 226, 231, 237, 822, 824

(56) References Cited

U.S. PATENT DOCUMENTS 5,903,380 A * 5/1999 Motamedi et al. .......... 359/224
6,070,656 A * 6/2000 Dickey ................... 165/114.26

OTHER PUBLICATIONS

Chen et al., *IEEE*, "A Low Voltage Micromachined Optical Switch By Stress–Induced Bending", pp. 424–428, 1999.
Cowan et al., *SPIE*, "Vertical Thermal Actuators for Micro–Opto–Electro–Mechanical Systems", vol. 3226, pp. 137–146, 1997.
R. Legtenberg et al., "Electrostatic Curved Electrode Actuators," *IEEE*, pp. 37–42 (1995).
T. Yasuda et al., CMOS Drivable Electrostatic Microactuator With Large Deflection, *IEEE*, pp. 90–95 (1997).
T. Akiyama et al., "A Quantitative Analysis of Scratch Drive Actuator Using Buckling Motion," *Proc. 8th IEEE International MEMS Workshop*, pp. 310–315 (1995).
K.S.J. Pister, "Micorfabricated hinges," *Sensors and Actuators—A Physical*, vol. A33, No. 3, pp. 249–256 (Jun. 1, 1992).
L. Y. Lin et al., "Free–Space Micromachined Optical Switches with Submillisecond Switching Time for Large-Scale Optical Crossconnects," *IEEE Photonics Technology Letters*, vol. 10, No. 4, pp. 525–527 (Apr. 1, 1998).

* cited by examiner

*Primary Examiner*—Ricky Mack
(74) *Attorney, Agent, or Firm*—Richard J. Botos

(57) ABSTRACT

An electro-mechanical structure which controls the movement of an optical device coupled thereto is disclosed. Both the electro-mechanical structure and the optical device are disposed on a substrate surface. The electro-mechanical structure controls the movement of the optical device by first lifting the optical device a predetermined distance above the plane of the substrate surface. Thereafter, the lifted optical device is moveable relative to the plane of the substrate surface in response to an electrostatic field generated between the electro-mechanical structure and the substrate.

23 Claims, 3 Drawing Sheets

MICRO-ELECTRO-MECHANICAL OPTICAL DEVICE

FIELD OF THE INVENTION

The present invention relates generally to optical communication systems and more particularly, to micro-electro-mechanical optical devices.

DESCRIPTION OF THE RELATED ART

Optical communication systems typically include a variety of optical devices (e. g., light sources, photodetectors, switches, attenuators, mirrors, amplifiers, and filters). The optical devices transmit, modify, or detect optical signals in the optical communications systems. Some optical devices are coupled to micro-electro-mechanical structures (e. g., thermal actuators) forming a micro-electro-mechanical optical device. The term micro-electro-mechanical structure as used in this disclosure refers to a microscopic structure which moves mechanically under the control of an electrical signal.

Cowan, William D., et al., "Vertical Thermal Actuators for Micro-Opto-Electro-Mechanical Systems", SPIE, Vol. 3226, pp. 137–146 (1997), describes a micro-electro-mechanical structure useful for moving optical devices. In Cowan et al., the micro-electro-mechanical structure is a thermal actuator. The thermal actuator is coupled to an optical mirror. Both the thermal actuator and the optical mirror are disposed on a surface of a substrate. The thermal actuator has multiple beams. A first end of each beam is coupled to the optical mirror. A second end of each beam is attached to the substrate surface.

Each beam of the thermal actuator has two material layers stacked one upon the other. The stacked material layers each have a different coefficient of thermal expansion.

The thermal actuator mechanically moves the optical mirror in response to a current being applied to the beams. Applying the current to the beams heats the stacked material layers. As the beams are heated, at least a portion of each beam is heated above the brittle to ductile transition of the material layers, causing a permanent mechanical deformation thereto which remains upon cooling. When the beams deform a first end of each beam as well as the optical mirror coupled thereto lift a predetermined height above the plane of the substrate surface. Such micro-electro-mechanical structures provide a limited range of motion for optical devices coupled thereto which makes them undesirable.

Therefore, micro-electro-mechanical optical devices capable of controlling the movement optical devices coupled thereto continue to be sought.

SUMMARY OF THE INVENTION

The present invention is directed to a micro-electro-mechanical structure which controls the movement of an optical device coupled thereto. Both the micro-electro-mechanical structure and the optical device are disposed on a substrate surface. The micro-electro-mechanical structure controls the movement of the optical device by first lifting the optical device a predetermined distance above the plane of the substrate surface. Thereafter, the lifted optical device is moveable relative to the plane of the substrate surface in response to an electrostatic field generated between the electro-mechanical structure and the substrate.

The micro-electro-mechanical structure includes one or more beams disposed on a substrate. A first end of each beam is coupled to the optical device. A second end of each beam is attached to the substrate surface.

The electro-mechanical structure lifts the optical device a predetermined distance above the plane of the substrate surface in response to the application of an activation force. The activation force lifts the first ends of the beams in an upward direction, substantially in an arc, above the plane of the substrate surface. As the first ends of the beams are lifted above the plane of the substrate surface, they also lift the optical device that is coupled thereto.

A variety of activation forces can be applied to the electro-mechanical structure to lift the optical device. Suitable examples include thermal contraction of the beam layers, beam contraction due to intrinsic stress, and electro-magnetic forces.

After the optical device is disposed above the plane of the substrate, the optical device moves relative to the plane of the substrate surface in response to an electrostatic field generated between the one or more beams of the electro-mechanical structure and the substrate. The electrostatic field is generated by applying a bias voltage between the beams and the substrate. The electrostatic field deflects the beams as well as the optical device coupled thereto toward the substrate surface. The magnitude of the beam deflection depends on the amount of the applied bias voltage.

The bias voltage that is applied between each beam and the substrate is variable. Varying the voltage applied between each beam and the substrate moves the optical device relative to the surface of the substrate with multiple degrees of freedom. In particular, the multiple degrees of freedom permit both multi-axis movement and translational movement for the optical device.

Both the substrate and the beams are preferably conductive so that the bias voltage may be applied thereto, When either of the substrate or the beams are insufficiently conductive to deflect the beams toward the substrate surface, conductive layers (e. g., electrodes) are optionally formed on regions thereof.

The beams optionally include insulating regions on the undersurface thereof. The insulating regions prevent the beams from shorting to the substrate surface when the bias voltage is applied therebetween.

Other objects and features of the present invention will become apparent from the following detailed description considered in conjunction with the accompanying drawings. It is to be understood, however, that the drawings are designed solely for purposes of illustration and do not serve to limit the invention, for which reference should be made to the appended claims.

DETAILED DESCRIPTION

Figure 1:
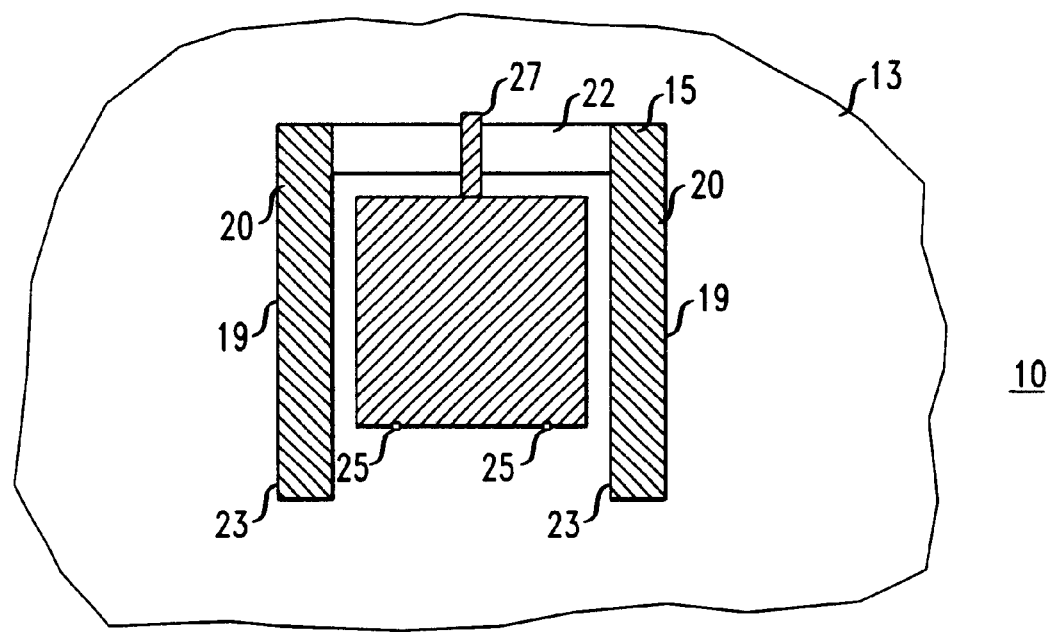
FIG. 1 depicts a top view of a substrate having a micro-electro-mechanical optical device of the present invention disposed on a surface thereof including an optical device coupled to a micro-electro-mechanical structure.

The present invention is directed to a micro-electro-mechanical optical device suitable for use in optical communication systems. Referring to FIG. 1, the micro-electro-mechanical optical device includes a micro-electro-mechanical structure 15 and an optical device 17 disposed on a surface of a substrate 13. The micro-electro-mechanical structure 15 is coupled to the optical device 17. The micro-electro-mechanical structure 15 controls the movement of the optical device 17.

The micro-electro-mechanical structure 15 controls the movement of the optical device 17 by first lifting such optical device 17 above the plane of the substrate surface 13. Thereafter, the lifted optical device 17 moves in response to an electrostatic field generated between the micro-electro-mechanical structure 15 and the substrate surface 13.

The micro-electro-mechanical structure 15 includes one or more beams 19. A first end 20 of each beam 19 is optionally coupled one to another with a tether 22. A second end 23 of each beam 19 is attached to the substrate surface 13.

The optical device 17 is coupled to the beams 19 as well as the substrate surface 13. In one embodiment of the micro-electro-mechanical optical device of the present invention, one edge 25 of the optical device 17 is in hinged attachment with the surface of the substrate 13, as shown in FIG. 1. Alternatively, edge 25 of the optical device 17 is attached to the surface of the substrate with springs (not shown).

Figure 2:
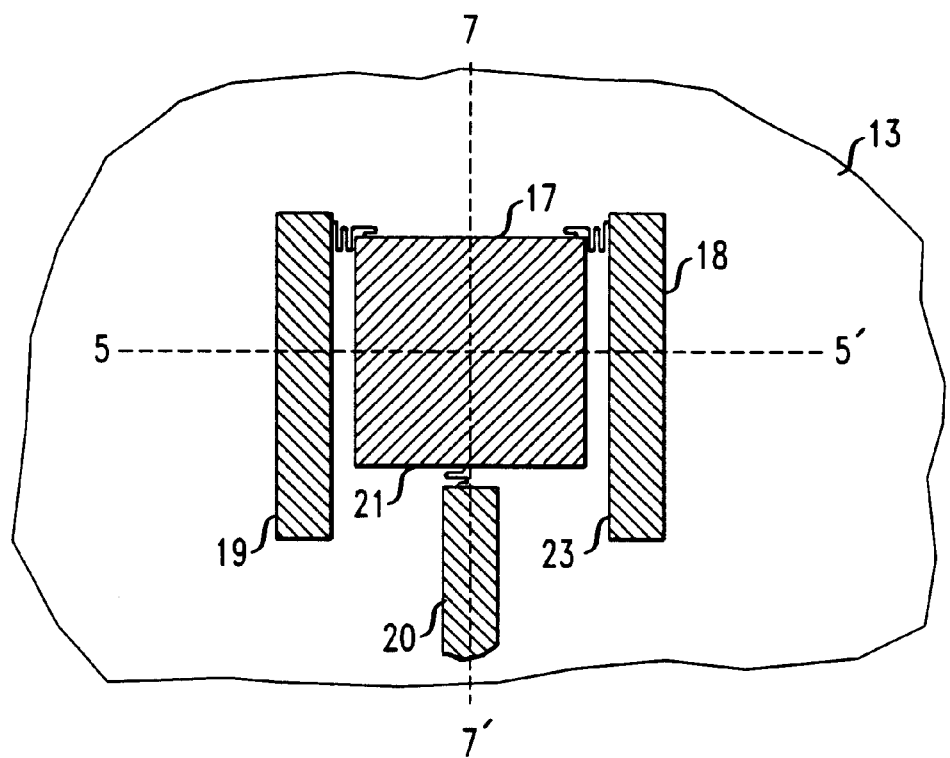
FIG. 2 shows a top view of the optical device coupled to both the substrate surface and the micro-electro-mechanical structure via beams.

An opposite edge 27 of the optical device 17 is coupled to the first end 20 of the beams 19 via the tether 22. Alternatively, the optical device 17 is coupled to the substrate surface 13 via the beams 19, as shown in FIG. 2.

The micro-electro-mechanical structure 15 lifts the optical device 17 a predetermined distance above the plane of the substrate surface 13 in response to the application of an activation force. The activation force lifts the first ends of the beams in an upward direction, substantially in an arc, above the plane of the substrate surface. As the first ends of the beams 19 are lifted above the plane of the substrate surface 13, they also lift the optical device 17 that is coupled thereto, as shown in the cross-sectional view of FIG. 3. Alternatively, three or more beams 17, 18, 19 coupled to the optical device optionally lift such optical device 17 to an orientation substantially planar with respect to the substrate surface as shown in FIG. 4.

Figure 5:
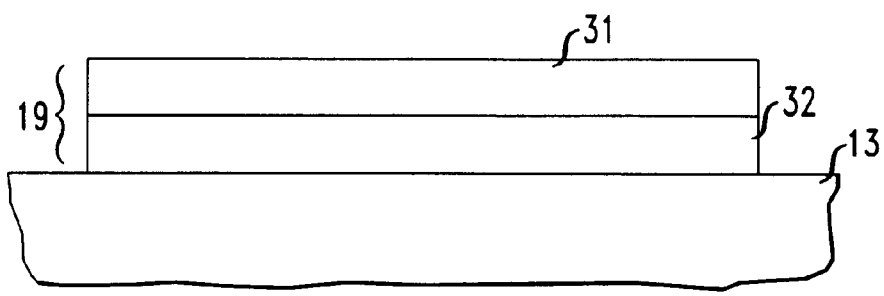
FIG. 5 is a cross-sectional view of one configuration for the micro-electro-mechanical structure before an activation force is applied thereto.

A variety of activation forces can be applied to the electro-mechanical structure to lift the first ends of the beams. Referring to FIG. 5, when the activation force applied to the electro-mechanical structure is based on thermal contraction of the beams, each beam 19 includes two or more material layers 31, 32 stacked one upon the other. The stacked material layers 31, 32 each have a different coefficient of thermal expansion. In one embodiment, the topmost material layer 31 of each beam 19 has a coefficient of thermal expansion larger than that of the other material layer 32.

Figure 6:
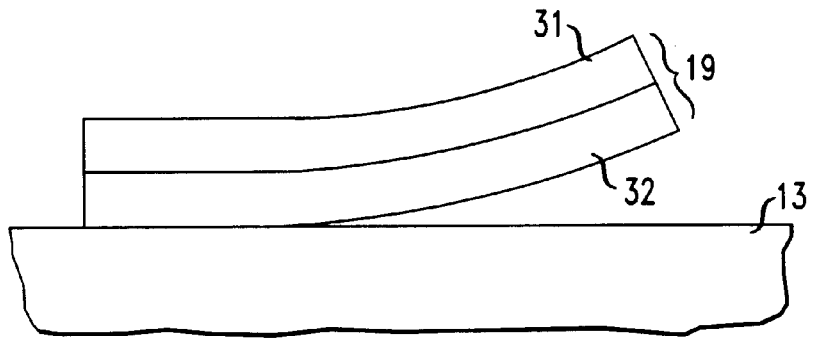
FIG. 6 is a cross-sectional view of the micro-electro-mechanical structure of FIG. 5 after the activation force has been applied thereto.

Applying a current to the beams 19 heats the stacked material layers 31, 32. The current is applied to the beams 19 from a current source (not shown). Referring to FIG. 6, when the stacked material layers 31, 32 are heated they curl up, lifting the first end of each beam 19 as well as the optical mirror (not shown) coupled thereto above the plane of the substrate surface 13. The height that the optical mirror is lifted to depends on the length of the beams as well as the composition of the material layers used to form the beams.

Figure 7:
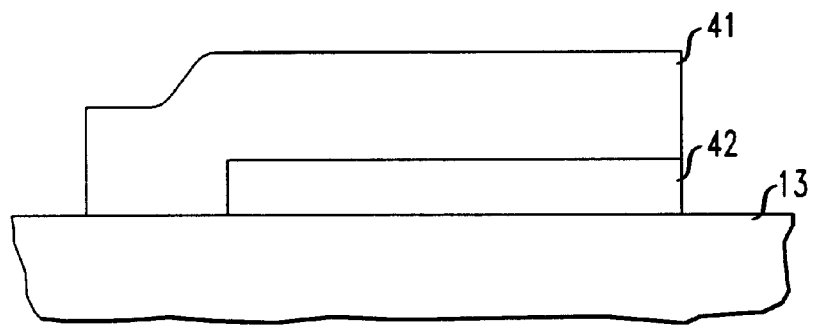
FIG. 7 is a cross-sectional view of an alternate configuration for the micro-electro-mechanical structure before an activation force is applied thereto.
Figure 8:
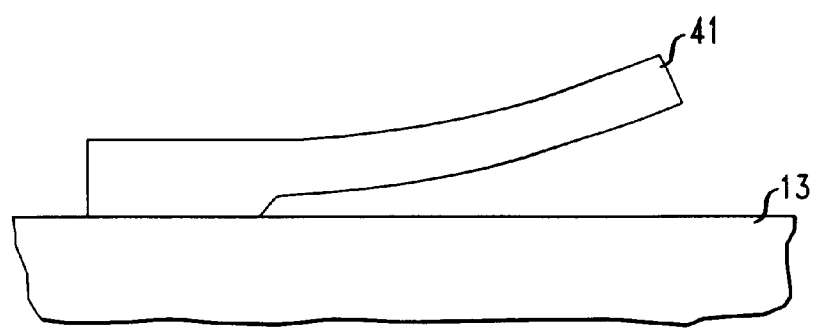
FIG. 8 is a cross-sectional view of the micro-electro-mechanical structure of FIG. 7 after the activation force is applied thereto.

Alternatively, when the activation force applied to the micro-electro-mechanical structure is based on beam contraction due to intrinsic stress, each beam 19 includes two or more material layers 41, 42 stacked one upon the other on the substrate surface 13, as shown in FIG. 7. The topmost material layer 41 has an intrinsic stress. The topmost material layer optionally has a stress gradient therein. The bottom material layer 42 is a sacrificial layer.

When the sacrificial material layer 42 is removed (e.g., by etching), the topmost one or more layers 41 lift the first end of each beam 19 as well as the optical mirror (not shown) coupled thereto above the plane of the substrate surface 13. The height that the optical mirror is lifted to depends on the length of the beams as well as the composition of the material layers used to form such beams.

Other suitable activation forces include scratch drives, and electromagnetic forces. Illustrative electro-mechanical structures based on scratch drives are discussed in Akiyam, T. et al., "A Quantitative Analysis of Scratch Drive Actuator Using Buckling Motion", Proc. $8^{th}$ IEEE International MEMS Workshop, pp. 310–315 (1995) and electro-mechanical structures based on electromagnetic forces are discussed in Busch-Vishniac, I. J., "The Case for Magnetically Driven Microactuators", Sensors and Actuators A, A33, pp. 207–220, (1992).

After the optical device is disposed above the plane of the substrate surface, the optical device moves relative to the plane of the substrate surface in response to an electrostatic field generated between the beams of the electro-mechanical structure and the substrate. The electrostatic field is generated by applying a bias voltage between the beams and the substrate.

Figure 3:
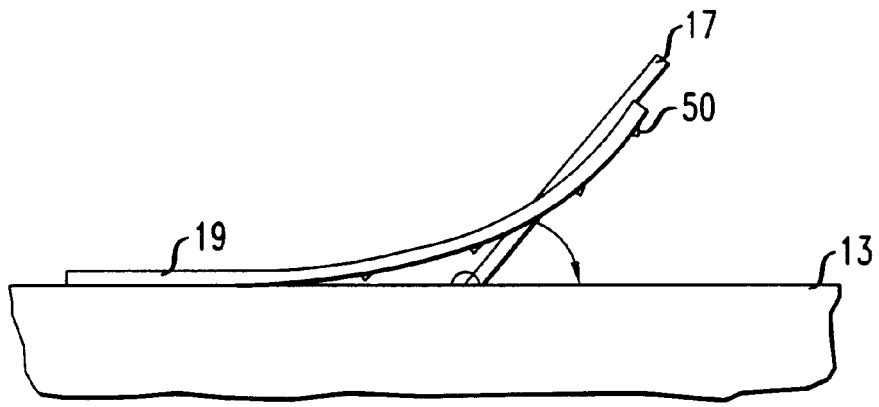
FIG. 3 is a cross-sectional view of the micro-electro-mechanical optical device of FIG. 1 after the optical device is lifted above the plane of the substrate surface by the micro-electro-mechanical structure.
Figure 4:
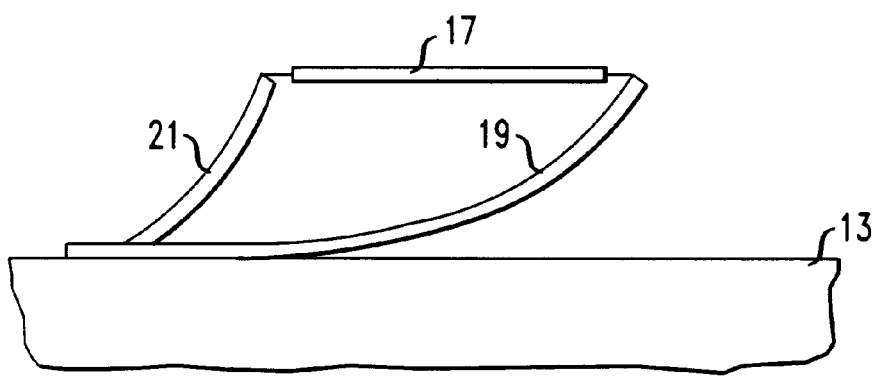
FIG. 4 is a cross-sectional view of the micro-electro-mechanical optical device of FIG. 2 after the optical device is lifted above the plane of the substrate surface by the micro-electro-mechanical structure.

Referring to FIG. 3, when the electrostatic field is generated between the beams 19 of the electro-mechanical structure and the substrate 13, such electrostatic field deflects the beams 19 as well as the optical device 17 coupled thereto toward the substrate surface 13. The distance that the beams 19 as well as the optical device 17 are deflected toward the substrate depends on the magnitude of the electrostatic field generated between the beams of the electro-mechanical structure and the substrate. The magnitude of the beam deflection depends on the amount of the applied bias voltage.

The bias voltage that is applied to each beam is variable. Varying the voltage applied between each beam and the substrate moves the optical device relative to the surface of the substrate with multiple degrees of freedom. In particular, the multiple degrees of freedom permit both multi-axis movement and translational movement for the optical device.

When the beams include patterned electrodes or patterned stress gradients on portions thereof, varying the bias voltage applied to such beams uncurls portions of the beams depending on the positions of the patterned electrodes or stress gradients.

Referring to the electro-mechanical optical device depicted in FIG. 2. After the optical device 17 is lifted to an orientation substantially planar with respect to the substrate surface (FIG. 4), when the voltage applied to beams 18, 19 is about the same, the optical device tilts about a single axis perpendicular to such beams 18, 19, denoted as 5–5' in FIG. 2. However, when the voltage applied to beams 18, 19 is different, the optical device tilts about two axes. One axis is perpendicular to the beams, denoted as 5–5'. The other axis is parallel to the beams, denoted as 7–7'.

Both the beams and the substrate are preferably conductive so that the bias voltage may be applied across them to generate the electrostatic field. When either of the beams or the substrate are insufficiently conductive to generate the electrostatic field, conductive layers (e.g., electrodes) are optionally formed on regions thereof.

Referring again to FIG. 3, the beams 19 optionally include dimples 50 on the undersurface thereof which correspond to insulating regions (not shown) on the substrate surface. This arrangement prevents the beams from shorting with the substrate 13 surface when the electrostatic field is generated therebetween.

The micro-electro-opto-mechanical device of the present invention is fabricated by providing a substrate that is suitably prepared (i.e., doped, as appropriate) and cleaned. Suitable substrate materials include silicon, gallium arsenide, indium phosphide, germanium or indium tin oxide (ITO) coated glass.

A plurality of material layers are formed in a planar arrangement on a surface of the substrate. Examples of suitable material layers include polysilicon, silicon nitride, and silicon dioxide.

After each material layer of the plurality of material layers are formed on the substrate, each layer is patterned to form a micro-electro-mechanical structure as well as an optical device. For example, the electro-opto-mechanical device shown in FIG. 1, including a mirror 17 as well as beams 19, is fabricated using a Multi-User MEMS Process (MUMPS) provided by the MCNC MEMS Technology Applications Center, MCNC, Research Triangle Park, N.C. (see Smart-MUMPs Design Handbook at mems.mcnc.org).

In the MUMPS process the micro-electro-mechanical structure and the optical mirror are formed in polysilicon layers, oxide layers (e.g., phosphosilicon glass) provides sacrificial layers, and silicon nitride electrically isolates the micro-electro-mechanical structure and optical mirror from the substrate. The micro-electro-mechanical structure and optical mirror are formed in the polysilicon layers with multiple photolithography steps.

Photolithography is a process which includes the coating of one or more of the polysilicon layers and phosphosilicon glass layers with a photoresist (i. e., an energy sensitive material), exposure of the photoresist with an appropriate mask, and developing the exposed photoresist to create the desired etch mask for subsequent pattern transfer into the one or more underlying polysilicon layers and phosphosilicon glass layers. The pattern defined in the photoresist is transferred into the one or more underlying polysilicon layers and phosphosilicon glass layers by etching for example in a reactive ion etch (RIE) system.

The following examples are provided to illustrate a specific embodiment of the present invention.

EXAMPLE 1

A micro-electro-mechanical optical device having the structure depicted in FIG. 1 was obtained from the MEMS Technology Application Center, MCNC, Research Triangle Park, N.C. The micro-electro-mechanical optical device was disposed on a surface of a silicon substrate. The silicon substrate had a resistivity of about 1–2 ohm-cm. The micro-electro-mechanical optical device was formed in a patterned multi-layered planar arrangement consisting of silicon nitride, a polysilicon layer, a phosphosilicon glass layer, a polysilicon layer, a phosphosilicon glass layer, a polysilicon layer, and a chromium/gold (Cr/Au) layer formed on the silicon substrate.

Referring to FIG. 1, the electro-mechanical structure 15 and the optical device 17 were defined in the multi-layered planar arrangement using photolithographic techniques. The electro-mechanical structure included two beams coupled together at one edge with a tether. The beams each had a width of about 100 $\mu$m and a length of about 700 $\mu$m. The Cr/Au layer was patterned to have a triangular shape that tapers to a point at the end opposite the tether. The tether was defined in only the second polysilicon layer. The tether had a length of about 300 $\mu$m and a width of about 3 $\mu$m.

The optical device was a mirror having dimensions of about 300 $\mu$m×300 $\mu$m. A finger protruding from a top edge of the optical device rested on the tether, coupling it to the two beams. A bottom edge of the optical device is coupled to the substrate with a spring.

The polysilicon glass silicon layers were removed by etching them in a bath of 49% HF at room temperature for about 1–2 minutes.

After the polysilicon glass layers were removed, the beams lifted the tether as well as the optical device off of the substrate surface. The beams were lifted due to the strain properties of the Cr/Au layer. The beams lifted the optical device to an angle of about 5° with respect to the substrate surface.

A voltage of about 100 was applied between the beams and an electrode on the substrate. After the voltage was applied between the beams and the electrode the optical device was oriented at an angle of about 0° with respect to the substrate surface.

EXAMPLE 2

A micro-electro-mechanical optical device having the structure depicted in FIG. 2 was formed. The micro-electro-mechanical device includes three beams coupled to an optical device with springs.

The micro-electro-mechanical optical device had the same multi-layered structure described above in Example 1.

After the sacrificial layers were removed, the beams lifted the optical device off of the substrate surface. The beams were lifted due to the strain properties of the Cr/Au layer. The beams completely lifted the optical device above the surface of the substrate to a substantially planar orientation with respect to the substrate surface.

A voltage of about 100 V was applied between beams 18, 19 and an electrode on the substrate. After the voltage was applied between beams 18, 19 and the electrode the end of the optical device coupled to beams 18, 19 tilted about the axis denoted as 5–5', so that the end of the optical device coupled to beam 20 was at an angle of about 5° with respect to the substrate surface.

EXAMPLE 3

A micro-electro-mechanical optical device having the structure described in Example 2 was provided. The optical device was lifted above the surface of the substrate to a substantially planar orientation with respect to the substrate surface as described in Example 2.

A voltage of about 100 V was applied between beam 19 and the substrate. A voltage of about 0 V was applied between beam 18 and the electrode. After the voltage was applied between the beams 18, 19 and the electrodes the optical device tilted about the axes denoted as 5–5' and 7–7' so that the corner of the optical device denoted as 21 was at an angle of about 2° with respect to the substrate surface so that the substrate surface corner denoted as 21 was the closest point to the substrate surface.

The invention claimed is:

1. A micro-electro-mechanical optical device, comprising:
    a substrate having an optical device and an electro-mechanical structure disposed on a surface thereof wherein the electro-mechanical structure includes a plurality of beams, the beams having a first end coupled to the optical device and a second end coupled to the substrate and wherein the electro-mechanical structure lifts the optical device above the plane of the substrate surface in response to an activation force, and wherein the lifted optical device is movable relative to the plane of the substrate surface in response to the generation of an electrostatic field between the electro-mechanical structure and the substrate.

2. The micro-electro-mechanical optical device of claim 1 wherein the optical device is an optical mirror.

3. The micro-electro-mechanical optical device of claim 2, wherein each beam comprises one or more material layers.

4. The micro-electro-mechanical optical device of claim 3 wherein each beam comprises a first material layer and a second material layer, wherein the first material layer is characterized by a first coefficient of thermal expansion and the second material layer is characterized by a second coefficient of thermal expansion different from the first coefficient of thermal expansion.

5. The micro-electro-mechanical optical device of claim 3 wherein at least one of the one or more material layer has an intrinsic stress.

6. The micro-electro-mechanical optical device of claim 3 wherein the one or more material layers are selected from the group consisting of silicon nitride, polysilicon, silicon dioxide, and metal.

7. The micro-electro-mechanical optical device of claim 3 wherein at least one of the one or more material layers has a stress gradient.

8. The micro-electro-mechanical optical device of claim 1 wherein the electric field is generated by applying a bias voltage between the beams and the surface of the substrate.

9. The micro-electro-mechanical optical device of claim 1 wherein the electric field is generated by applying a bias voltage between the beams and the surface of the substrate.

10. The micro-electro-mechanical optical device of claim 1, wherein the electric field applied to each beam is about equal.

11. The micro-electro-mechanical optical device of claim 1 wherein the electric field applied to each beam is different.

12. An optical communication system, comprising:
    a substrate having a micro-electro-mechanical optical device disposed on a surface thereof, wherein the micro-electro-mechanical optical device includes an optical device and a micro-electro-mechanical structure comprising a plurality of beams having a first end coupled to the optical device and a second end coupled to the substrate; and
    wherein the micro-electro-mechanical structure lifts the optical device above the plane of the substrate surface in response to an activation force, and wherein the lifted optical device is movable relative to the plane of the substrate surface in response to the generation of an electric field between the micro-electro-mechanical structure and the substrate.

13. A method for moving an optical device, comprising the steps of:
    providing a substrate having an optical device and a micro-electro-mechanical structure disposed on a surface thereof, wherein the micro-electro-mechanical structure includes a plurality of beams, wherein each beam has a first end coupled to the optical device and a second end coupled to the substrate;
    lifting the optical device above the plane of the substrate surface by applying an activation force to the electro-mechanical structure; and
    moving the lifted optical device relative to the plane of the substrate surface by generating an electric field between the micro-electro-mechanical structure and the substrate.

14. The method of claim 13 wherein the optical device is an optical mirror.

15. The method of claim 13 wherein the electric field is generated by applying a bias voltage between the beams and the surface of the substrate.

16. The method of claim 13 wherein each beam comprises one or more material layers.

17. The method of claim 16 wherein each beam comprises a first material layer and a second material layer, wherein the first material layer is characterized by a first coefficient of thermal expansion and the second material layer is characterized by a second coefficient of thermal expansion different from the first coefficient of thermal expansion.

18. The method of claim 16 wherein at least one of the one or more material layers has an intrinsic stress.

19. The method of claim 16 wherein the one or more material layers are selected from the group consisting of silicon nitride, polysilicon, silicon dioxide, and metal.

20. The method of claim 16 wherein at least one of the one or more material layers has a stress gradient.

21. The method of claim 13 wherein the electric field is generated by applying a bias voltage between the beams and an electrode on the surface of the substrate.

22. The method of claim 13 wherein the electric field applied to each beam is about equal.

23. The method of claim 13 wherein the electric field applied to each beam is different.

* * * * *